US009881696B2

(12) United States Patent
Lee

(10) Patent No.: US 9,881,696 B2
(45) Date of Patent: Jan. 30, 2018

(54) STORAGE DEVICE AND OPERATING METHOD THEREOF

(71) Applicant: Ju Seok Lee, Seoul (KR)

(72) Inventor: Ju Seok Lee, Seoul (KR)

(73) Assignee: SAMSUNG ELECTRONICS, CO., LTD., Gyeonggi-do (KR)

(*) Notice: Subject to any disclaimer, the term of this patent is extended or adjusted under 35 U.S.C. 154(b) by 166 days.

(21) Appl. No.: 14/925,077

(22) Filed: Oct. 28, 2015

(65) Prior Publication Data
US 2016/0124809 A1 May 5, 2016

(30) Foreign Application Priority Data

Oct. 30, 2014 (KR) .................. 10-2014-0149388

(51) Int. Cl.
G11C 29/00 (2006.01)
G11C 29/52 (2006.01)
G11C 16/34 (2006.01)
G11C 29/42 (2006.01)
G06F 11/10 (2006.01)
G11C 29/04 (2006.01)

(52) U.S. Cl.
CPC ............ G11C 29/52 (2013.01); G06F 11/108 (2013.01); G11C 16/3418 (2013.01); G11C 29/42 (2013.01); *G11C 2029/0411* (2013.01)

(58) Field of Classification Search
CPC .. G06F 11/1072; G06F 3/0611; G06F 3/0619; G06F 3/0688; G06F 3/0656; G06F 11/108; G06F 12/0246; G06F 2212/1032; G06F 2212/7208; G06F 3/061; G06F 3/0614; G06F 3/0625; G11C 29/52; G11C 29/42; G11C 16/3418; G11C 2029/0411
See application file for complete search history.

(56) References Cited

U.S. PATENT DOCUMENTS

| 7,047,358 | B2 | 5/2006 | Lee et al. |
| 7,296,128 | B2 | 11/2007 | Lee |
| 7,679,133 | B2 | 3/2010 | Son et al. |
| 7,721,146 | B2 | 5/2010 | Polisetti et al. |
| 7,729,175 | B2 | 6/2010 | Cho et al. |
| 7,827,469 | B2 | 11/2010 | Subbarao |
| 7,941,696 | B2 | 5/2011 | Frost et al. |
| 8,307,271 | B1 | 11/2012 | Liu et al. |
| 8,339,854 | B2 | 12/2012 | Yoon |
| 8,443,136 | B2 | 5/2013 | Frost et al. |
| 8,553,466 | B2 | 10/2013 | Han et al. |
| 8,559,235 | B2 | 10/2013 | Yoon et al. |
| 8,560,881 | B2 | 10/2013 | Frost et al. |
| 8,631,274 | B2 | 1/2014 | Frost et al. |
| 8,654,587 | B2 | 2/2014 | Yoon et al. |

(Continued)

*Primary Examiner* — Guerrier Merant
(74) *Attorney, Agent, or Firm* — Harness, Dickey & Pierce

(57) ABSTRACT

An operating method of a storage device includes simultaneously buffering first data in a first nonvolatile memory device and a second nonvolatile memory device, simultaneously buffering second data in the second nonvolatile memory device and a third nonvolatile memory device, performing a parity operation on the first data and the second data in the second nonvolatile memory device to generate a parity, and programming the first data, the second data, and the parity into the first nonvolatile memory device, the third nonvolatile memory device, and the second nonvolatile memory device, respectively.

18 Claims, 16 Drawing Sheets

(56) References Cited

U.S. PATENT DOCUMENTS

| | | |
|---|---|---|
| 8,751,729 B2 | 6/2014 | Mun et al. |
| 8,788,876 B2 | 7/2014 | Jeddeloh |
| 8,812,933 B2 | 8/2014 | Joo et al. |
| 8,856,428 B2 | 10/2014 | Lee et al. |
| 8,885,409 B2 | 11/2014 | Lee et al. |
| 8,990,481 B2 | 3/2015 | Yoon et al. |
| 9,612,773 B2 * | 4/2017 | Choi ................ G06F 3/0661 |
| 2003/0120864 A1 | 6/2003 | Lee et al. |
| 2003/0120865 A1 | 6/2003 | McDonald et al. |
| 2004/0202034 A1 | 10/2004 | Lee |
| 2007/0294570 A1 | 12/2007 | Polisetti et al. |
| 2008/0040646 A1 * | 2/2008 | Forhan ............ G06F 11/1076 714/770 |
| 2008/0285352 A1 | 11/2008 | Cho et al. |
| 2009/0094479 A1 | 4/2009 | Subbarao |
| 2009/0121271 A1 | 5/2009 | Son et al. |
| 2009/0172335 A1 * | 7/2009 | Kulkarni ............ G06F 3/061 711/170 |
| 2010/0125695 A1 | 5/2010 | Wu et al. |
| 2010/0259983 A1 | 10/2010 | Yoon |
| 2011/0041037 A1 | 2/2011 | Frost et al. |
| 2011/0087855 A1 | 4/2011 | Frost et al. |
| 2011/0213920 A1 | 9/2011 | Frost et al. |
| 2011/0216603 A1 | 9/2011 | Han et al. |
| 2011/0233648 A1 | 9/2011 | Seol et al. |
| 2012/0051143 A1 | 3/2012 | Yoon et al. |
| 2012/0166714 A1 | 6/2012 | Mun et al. |
| 2012/0221775 A1 | 8/2012 | Kim et al. |
| 2012/0221781 A1 | 8/2012 | Frost et al. |
| 2012/0254680 A1 * | 10/2012 | Oh .................. G06F 11/1068 714/723 |
| 2012/0272017 A1 | 10/2012 | Lee et al. |
| 2013/0019057 A1 | 1/2013 | Stephens |
| 2013/0117620 A1 | 5/2013 | Joo et al. |
| 2013/0124783 A1 | 5/2013 | Yoon et al. |
| 2013/0135932 A1 | 5/2013 | Lee et al. |
| 2013/0135934 A1 | 5/2013 | Kim et al. |
| 2013/0166857 A1 * | 6/2013 | Kawano ............ G06F 12/0246 711/155 |
| 2013/0235673 A1 * | 9/2013 | Kwak .................. G11C 16/06 365/185.18 |
| 2013/0250677 A1 * | 9/2013 | Nam .................. G11C 13/0002 365/185.03 |
| 2013/0254627 A1 * | 9/2013 | Jeddeloh .......... G06F 3/0616 714/764 |
| 2013/0268724 A1 * | 10/2013 | Seo .................. G06F 12/0246 711/103 |
| 2013/0279262 A1 | 10/2013 | Yoon et al. |
| 2013/0304970 A1 * | 11/2013 | Parizi .................. G06F 3/0611 711/103 |
| 2014/0022853 A1 | 1/2014 | Choi et al. |
| 2014/0029355 A1 | 1/2014 | Choi et al. |
| 2014/0108895 A1 | 4/2014 | Fujiwara |
| 2014/0153331 A1 | 6/2014 | Jang et al. |
| 2014/0185377 A1 | 7/2014 | Kim et al. |
| 2014/0281174 A1 | 9/2014 | Lee |
| 2015/0310923 A1 * | 10/2015 | Nam .................. G11C 16/0483 365/185.11 |

* cited by examiner

STORAGE DEVICE AND OPERATING METHOD THEREOF

CROSS-REFERENCE TO RELATED APPLICATIONS

This US non-provisional patent application claims priority under 35 USC § 119 to Korean Patent Application No. 10-2014-0149388, filed on Oct. 30, 2014, the disclosure of which is incorporated by reference in its entirety herein.

BACKGROUND

Technical Field

Embodiments of the present disclosure relate to storage devices and operating methods thereof.

Discussion of Related Art

In general, semiconductor memory devices are classified into volatile semiconductor memory devices and nonvolatile semiconductor memory devices. Nonvolatile semiconductor memory devices can retain their stored data even when their power supplies are interrupted. Data stored in a nonvolatile memory device may be permanent or reprogrammable depending memory manufacturing technology. The nonvolatile semiconductor memory device is used for storing programs and micro codes in a wide range of applications such as computers, avionics, communication, and consumer electronic technologies.

SUMMARY OF THE INVENTION

The present disclosure provides a storage device performing a RAID function and an operating method of the storage device.

An operating method of a storage device according to an example embodiment of the inventive concept may include simultaneously buffering first data in a first nonvolatile memory device and a second nonvolatile memory device; simultaneously buffering second data in the second nonvolatile memory device and a third nonvolatile memory device; performing a parity operation on the first data and the second data in the second nonvolatile memory device to generate a parity; and programming the first data, the second data, and the parity into the first nonvolatile memory device, the third nonvolatile memory device, and the second nonvolatile memory device, respectively.

In example embodiments, the first and second nonvolatile memories may be simultaneously activated in response to corresponding chip enable signals when the first data is simultaneously buffered in the first and second nonvolatile memories. Alternatively, the second and third nonvolatile memories may be simultaneously activated in response to corresponding chip enable signals when the first data is simultaneously buffered in the second and third nonvolatile memories.

In example embodiments, the parity operation may be performed in real time.

In example embodiments, the parity operation may be performed for an idle time.

In example embodiments, the parity operation may be an XOR operation.

In example embodiments, the parity operation may be performed at a page buffer in the second nonvolatile memory device.

In example embodiments, the operating method may further include determining whether data read from a certain nonvolatile memory device need to be restored when there is a read request.

In example embodiments, a redundant arrays of independent disks (RAID) engine may determine whether the read data need to be restored.

In example embodiments, the read data may be restored when an error of the read data cannot be corrected.

In example embodiments, the read data may be restored using a parity corresponding to the read data stored in another nonvolatile memory device.

In example embodiments, the operating method may further include inputting the first data to a buffer memory; simultaneously transmitting the first data to the first nonvolatile memory device and the second nonvolatile memory device from the buffer memory; inputting the second data to the buffer memory; and simultaneously transmitting the second data to the second nonvolatile memory device and the third nonvolatile memory device from the buffer memory.

In example embodiments, the parity operation may be performed by controlling a plurality of latches. Some of the latches may be used only in a read request for the second nonvolatile memory device when the read request is input while the parity operation is performed.

A storage device according to an example embodiment of the inventive concept may include a plurality of nonvolatile memories; and a memory controller configured to control the nonvolatile memories. The memory controller may transmit first data to a first nonvolatile memory device among the nonvolatile memories to perform a program operation and transmit the first data to a second nonvolatile memory device among the nonvolatile memories to perform a parity operation for generating a parity when there is a write request for the first data. The memory controller may transmit second data to a third nonvolatile memory device among the nonvolatile memories to perform a program operation and transmit the second data to the second nonvolatile memory device to perform a parity operation for generating a parity when there is a write request for the second data.

In example embodiments, the first, second, and third nonvolatile memories may be connected to the memory controller through their respective channels.

In example embodiments, the first, second, and third nonvolatile memories may be connected to the memory controller through a single channel.

In example embodiments, the storage device may further include a redundant arrays of independent disks (RAID) engine configured to determine whether data read from one of the nonvolatile memories need to be restored when there is a read request, read a parity corresponding to the read data from another nonvolatile memory device when the read data need to be restored, and restore the read data using the read parity.

In example embodiments, the storage device may further include a buffer memory configured to receive data from an external entity when there is a write request or output read data or restored data to the external entity when there is a read request.

In example embodiments, each of the nonvolatile memories may include a page buffer including a plurality of latches performing the parity operation.

In example embodiments, the parity operation may be performed for an idle time.

A nonvolatile memory device according to an example embodiment of the inventive concept may include a memory cell array including a plurality of memory blocks sharing bitlines; an address decoder configured to at least one of the memory blocks in response to an address; an input/output circuit connected to the bitlines and configured to receive data from an external entity during a program operation on the selected memory block; and a control logic configured to control the address decoder and the input/output circuit such that a parity is programmed into the selected memory block according to an external command. The input/output circuit may perform a parity operation on previously buffered data and the input data according to the control of the control logic to generate the parity.

According to the embodiments of the inventive concept, a RAID is internally implemented using nonvolatile memories performing an XOR operation to improve data reliability without additional burden.

BRIEF DESCRIPTION OF THE DRAWINGS

The accompanying drawings are included to provide a further understanding of the disclosure, and are incorporated in and constitute a part of this specification. The drawings illustrate example embodiments of the disclosure and, together with the description, serve to explain principles of the disclosure. In the drawings.

DETAILED DESCRIPTION

Example embodiments in accordance with the inventive concept will now be described more fully hereinafter with reference to the accompanying drawings.

A storage device according to an example embodiment of the inventive concept may implement a redundant array of independent disks (hereinafter referred to as "RAID") internally or in itself.

Figure 1:
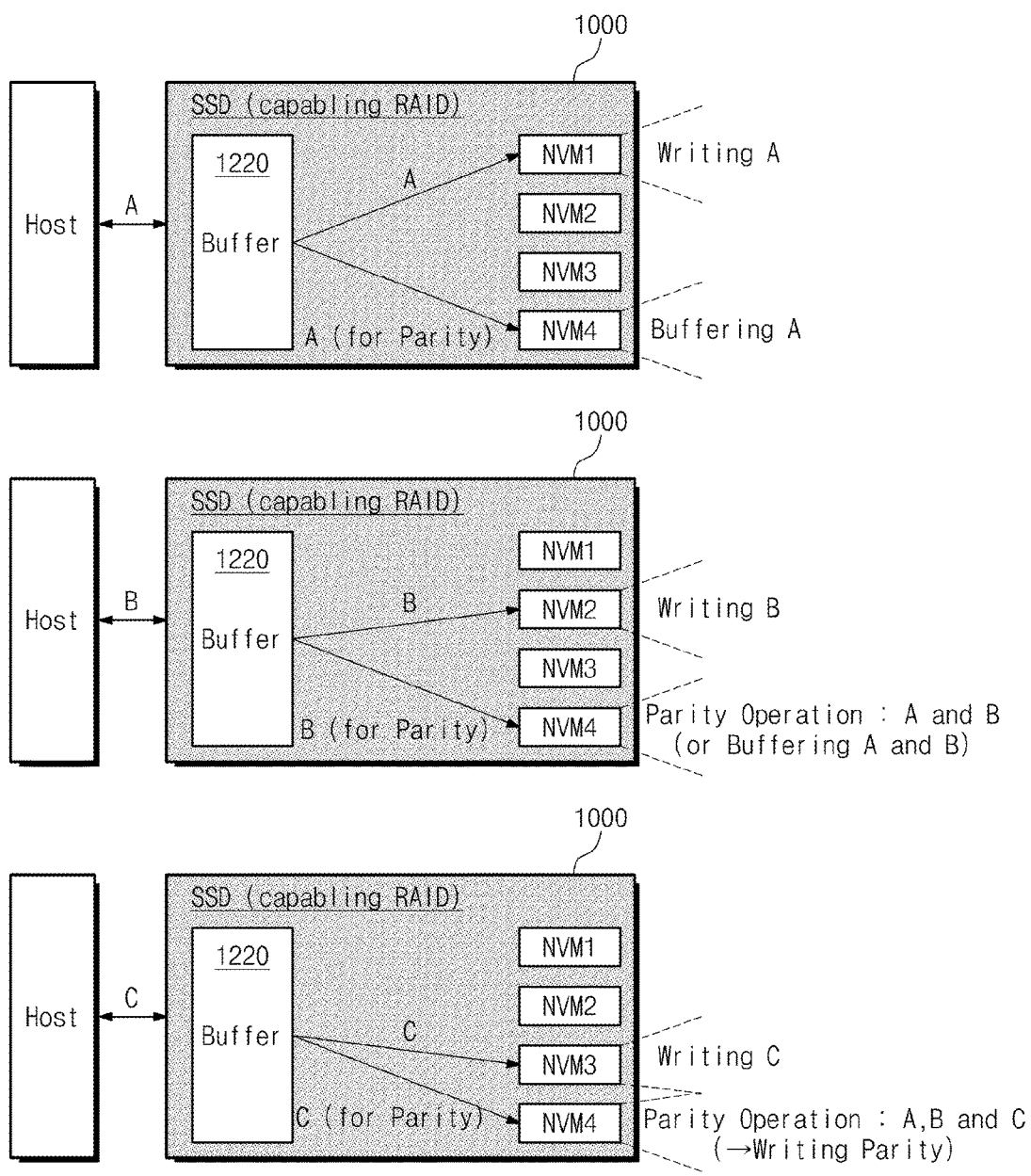
FIG. 1 illustrates the present inventive concept.

FIG. 1 illustrates the present inventive concept. The procedure of storing data A, B, and C in a storage device 100 at a host will be described with reference to FIG. 1. The storage device 1000 may be, for example, a solid-state drive (SSD). As illustrated, the storage device 1000 includes a buffer memory 1220 and a plurality of nonvolatile memories NVM1 to NVM4.

Each of the nonvolatile memories NVM1 to NVM4 may be a NAND flash memory, a vertical NAND flash memory (VNAND), a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM) or the like. Also, the nonvolatile memory device 100 may be implemented to have a three-dimensional array structure. In an example embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an example embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

A nonvolatile memory device according to the inventive concept may be applied to both a flash memory device in which a charge storage layer includes a conductive floating gate and a charge trap flash (CTF) memory device in which a charge storage layer is an insulating layer.

For brevity of description, a RAID implemented with fourth nonvolatile memories NVM1 to NVM4 is shown in FIG. 1. However, the inventive concept is not limited to the number of nonvolatile memories implementing a RAID according to the inventive concept.

When there is a write request of data A from a host, the data A may be written into a first nonvolatile memory device NVM1 after being transmitted to the first nonvolatile memory device NVM1 via a buffer memory 1220. Concurrently, the data A is transmitted to a fourth nonvolatile memory device NVM4 to generate a parity for the RAID. When the data A is transmitted to the fourth nonvolatile memory device NVM4, information that is data for performing a parity operation may also be transmitted. In some example embodiments, the fourth nonvolatile memory device NVM4 buffers the data A to generate the parity.

Next, when there is a write request of data B from the host, the data B may be written into a second nonvolatile memory device NVM2 after being transmitted to the second nonvolatile memory device NVM2 via the buffer memory 1220. Concurrently, the data B is transmitted to the fourth nonvolatile memory device NVM4 to generate a parity for the RAID. When the data B is transmitted to the fourth nonvolatile memory device NVM4, information that is data for performing a parity operation (or latch operation) may also be transmitted. In some example embodiments, the fourth nonvolatile memory device NVM4 may perform a parity operation on the previously buffered data A and input data B and store a result value. The parity operation may include an exclusive-OR (XOR) operation. In some example embodiments, the parity operation may be performed in real time or for an idle time. In other embodiments, the fourth nonvolatile memory device NVM4 may buffer the data A to generate a parity.

Next, when there is a write request of data C from the host, the data C may be written into a third nonvolatile memory device NVM3 after being transmitted to the third nonvolatile memory device NVM3 via the buffer memory 1220. Concurrently, the data C is transmitted to the fourth nonvolatile memory device NVM4 to generate a parity for the RAID. Information that is data for performing a parity operation may also be transmitted when the data C is transmitted to the fourth nonvolatile memory device NVM4. In some example embodiments, the fourth nonvolatile memory device NVM4 may perform a parity operation on the data A, the data B, and data C for generate a parity and may store a result value (parity). In some example embodiments, the parity operation may be performed in real time or for an idle time. In other embodiments, the fourth nonvolatile memory device NVM4 may write parity operation result values. In some example embodiments, a parity operation result value may be written in real time or for an idle time.

In some example embodiments, a size of each of the data A, the data B, and the data C may be a page unit and be smaller/larger than the page unit.

In some example embodiments, each of the nonvolatile memories NvM1 to NVM4 may be configured to perform a parity operation.

In some example embodiments, at least two of the nonvolatile memories NVM1 to NVM4 may be activated at the same time. That is, at least two of the nonvolatile memories NVM1 to NVM4 may be activated in response to a chip enable signal and the same data may be input to the activated nonvolatile memories.

The storage device 1000 may implement a RAID internally or in itself due to the nonvolatile memories NVM1 to NVM4. As a result, reliability of stored data may be improved much more than that of a conventional art.

A parity operation of each of the nonvolatile memories NVM1 to NVM4 may be performed by various manners or elements. Below, for the convenience of description, let it be assumed that a parity operation is performed according to management of latches of each of the nonvolatile memories NVM1 to NVM4.

Figure 2:
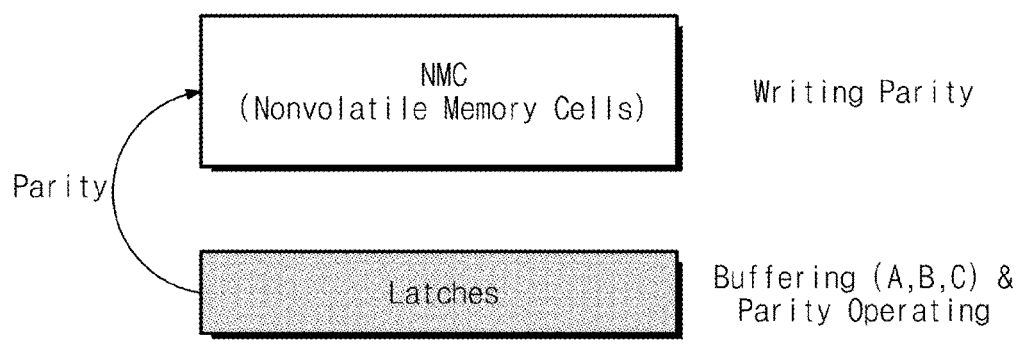
FIG. 2 illustrates an example embodiment of buffering and parity operations of a nonvolatile memory device shown in FIG. 1.

FIG. 2 illustrates an example embodiment of buffering and parity operations of the nonvolatile memory device NVM4 shown in FIG. 1. Referring to FIGS. 1 and 2, input data A, B, and C are buffered in the nonvolatile memory device NVM4. A parity operation is performed on the buffered data A, B, and C to generate a parity. The generated parity is written into nonvolatile memory device cells NMC.

In FIG. 2, buffering of the input data A, B, and C is carried out in latches. However, the inventive concept need not be limited thereto. Buffering of the input data A, B, and C may be carried out in a nonvolatile memory device cell.

Figure 3:
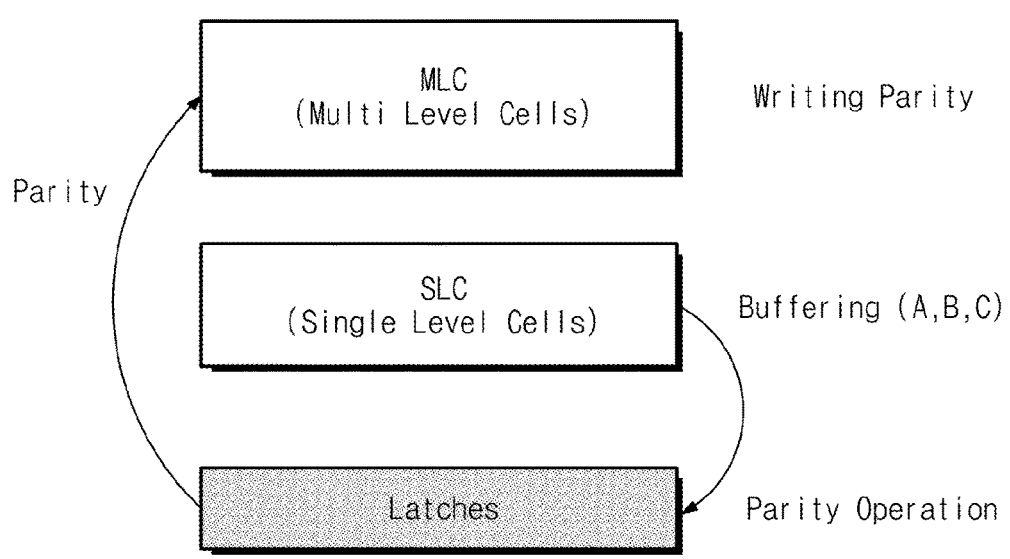
FIG. 3 illustrates another embodiment of buffering and parity operations of a nonvolatile memory device in FIG. 1.

FIG. 3 illustrates another embodiment of buffering and parity operations of the nonvolatile memory device NVM4 in FIG. 1. Referring to FIGS. 1 and 3, the input data A, B, and C are buffered to single-level cells (SLC) in the nonvolatile memory device NVM4. Latches read the data A, B, and C buffered to the SLC and performs a parity operation on the buffered data A, B, and C to generate a parity. In some example embodiments, the parity operation may be internally performed in the nonvolatile memory device NVM4 for an idle time. The generated parity is written into multi-level cells (MLC).

Figure 4:
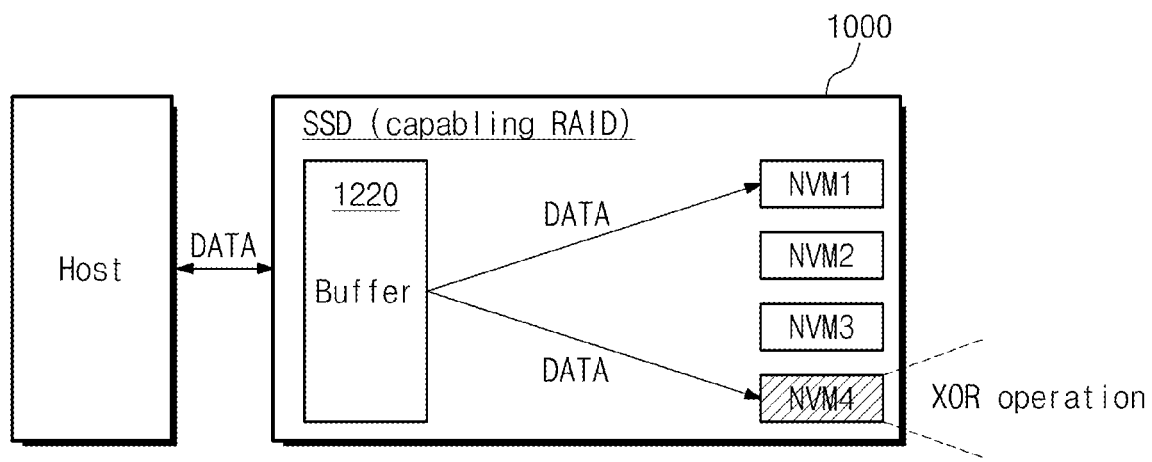
FIG. 4 illustrates a data input operation of a storage device according to an example embodiment of the inventive concept.

FIG. 4 illustrates a data input operation of a storage device according to an example embodiment of the inventive concept. Referring to FIG. 4, data DATA is transmitted to at least two nonvolatile memories NVM1 and NVM4 via a buffer memory 1220 during a data input operation. The data DATA may be simultaneously transmitted to the at least two nonvolatile memories NVM1 and NVM4. At least one nonvolatile memory device NVM4 performs an XOR operation between previously stored data and currently input data DATA. A parity is generated as a result of the XOR operation. The generated parity is written into the nonvolatile memory device NVM4 in real time or for an idle time. Thus, the generated parity is stored in at least one nonvolatile memory device NVM1 and its parity may be stored in another nonvolatile memory device NVM4.

Figure 5:
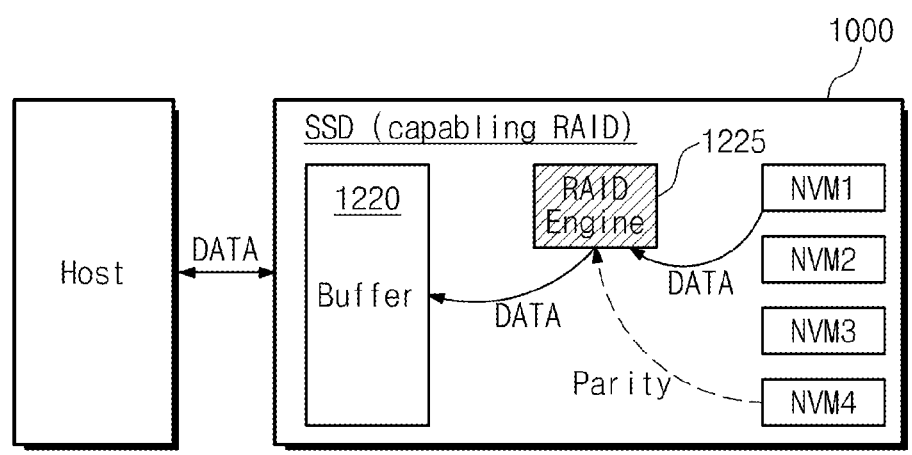
FIG. 5 illustrates a data output operation of a storage device according to an example embodiment of the inventive concept.

FIG. 5 illustrates a data output operation of a storage device 1000 according to an example embodiment of the inventive concept. Referring to FIG. 5, data DATA is read from at least one nonvolatile memory device NVM1 and input to a RAID engine 1225 during a data output operation (or read operation). If the read dataDATA need not be restored, the RAID engine 1225 transmits the dataDATA to the buffer memory 1220. If the read data DATA need to be restored, the RAID engine 1225 restores the dataDATA using the parity read from the nonvolatile memory device NVM4 and transmits the restored data to the buffer memory 1220.

In some example embodiments, the RAID engine 1225 may be implemented with software, hardware or firmware. The buffer memory 1220 outputs original dataDATA or restored data to an external host.

In some example embodiments, the RAID engine 1225 may be activated only during a data output operation. That is, the RAID engine 1225 may be deactivated during a data input operation.

In some example embodiments, the RAID engine may read data corresponding to original data DATA from the other nonvolatile memories NVM2 and NVM3 and restore the original dataDATA based on the data and parity read from the other nonvolatile memories NVM2 and NVM3.

In some example embodiments, the RAID engine 1225 may perform on an XOR operation on original dataDATA based on the data and parity read from the other memories NVM2 and NVM3 to restore the original dataDATA.

In some example embodiments, a data restoration operation of the RAID engine 1225 may be performed when an error of the read dataDATA cannot be corrected.

The storage device 1000 may be configured to simultaneously perform a read operation and a parity operation during a read operation in a single nonvolatile memory device.

Figure 6:
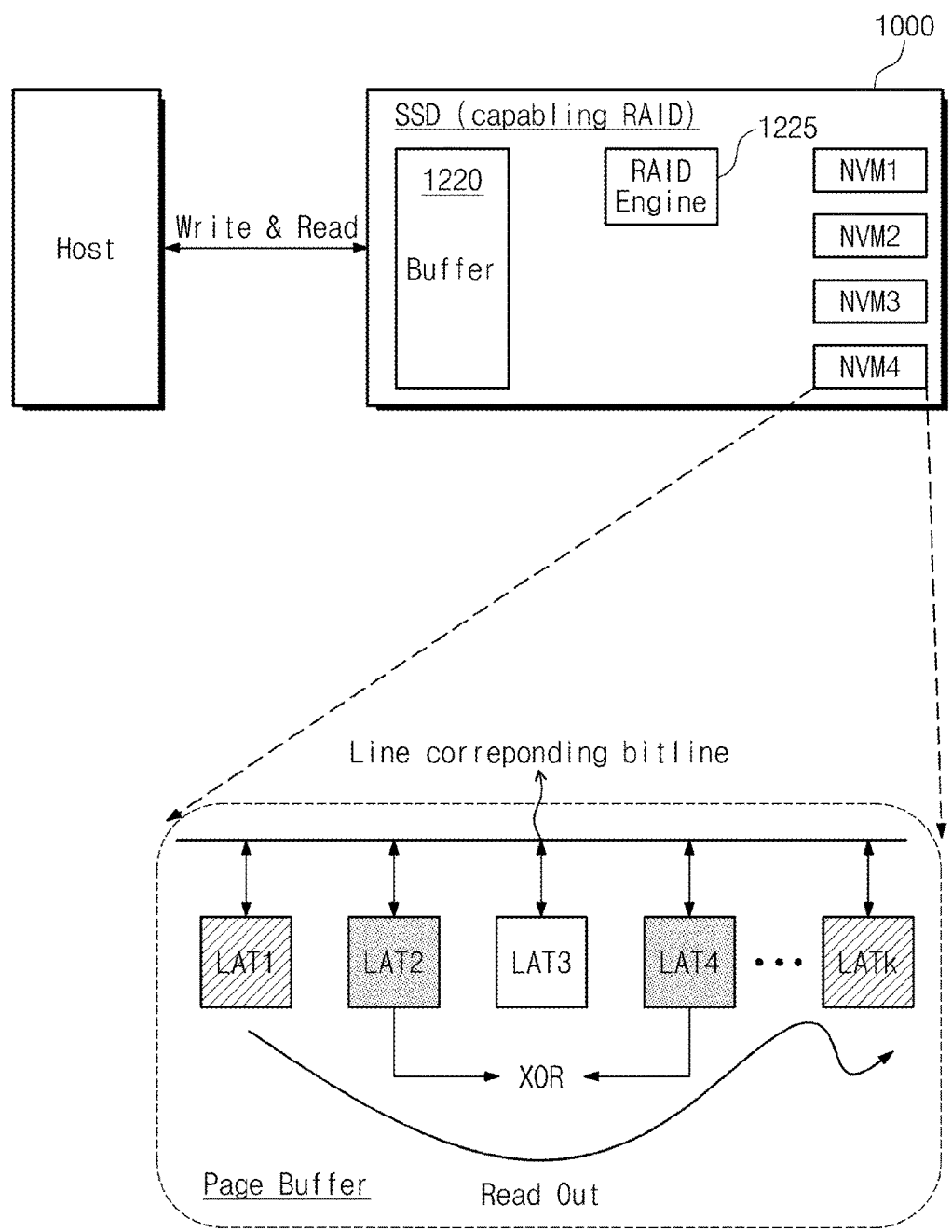
FIG. 6 conceptually illustrates that a parity operation during a write operation and a read operation are simultaneously performed during a write operation of a storage device according to an example embodiment of the inventive concept.

FIG. 6 conceptually illustrates that a parity operation during a write operation and a read operation are simultaneously performed during a write operation of a storage device 1000 according to an example embodiment of the inventive concept. Referring to FIG. 6, a parity operation of a write operation may be an XOR operation and the XOR operation may be performed in a page buffer of a nonvolatile memory device NVM4. The page buffer may include latches LAT1 to LATk (k being an integer greater than or equal to 2).

In some example embodiments, some of the latches LAT1 to LATk (e.g., LAT2 and LAT4) may be used for a parity operation (e.g., XOR operation) of a write operation.

In some embodiments, some of the latches LAT1 to LATk (e.g., LAT1 and LATk) may be used for a read operation. For example, a read operation may be performed only using a sensing latch and a cache latch during an XOR operation.

Figure 7:
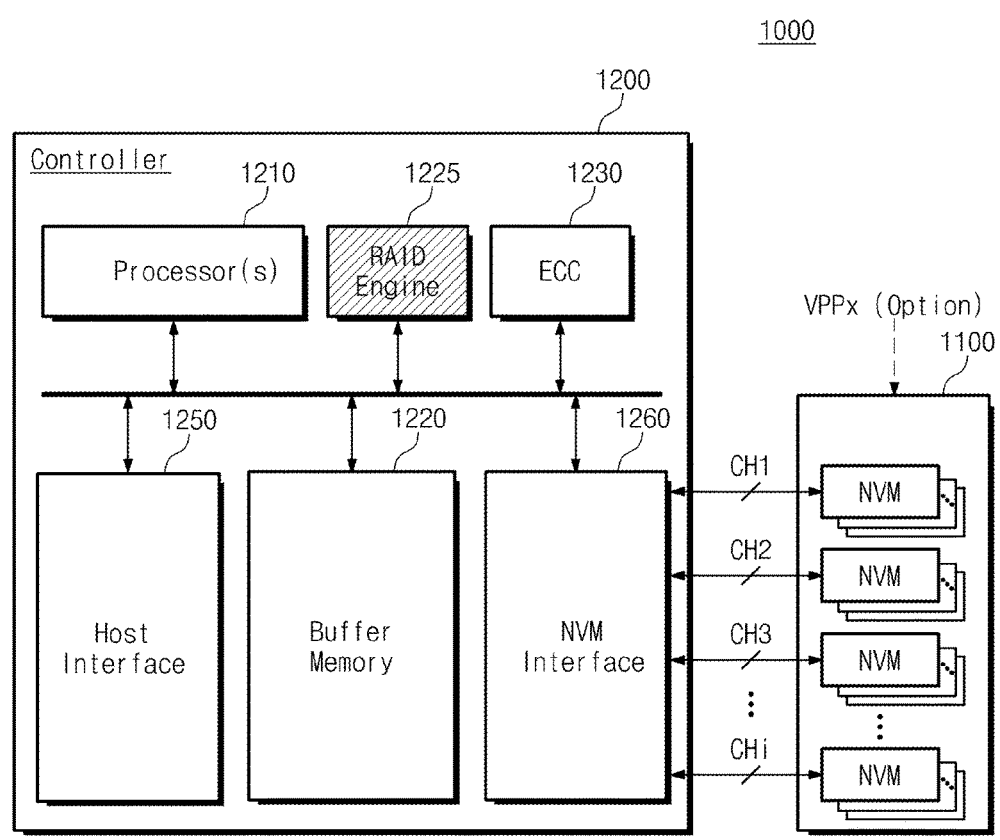
FIG. 7 is an example block diagram of a storage device according to an example embodiment of the inventive concept.

FIG. 7 is an example block diagram of a storage device according to an example embodiment of the inventive concept. As illustrated, the storage device 1000 includes a plurality of nonvolatile memories 1100 and a memory controller 1200. The storage device 1000 may be a storage medium such as an SSD, a memory card (e.g., CF, SD, microSD, miniSD, UFS card, etc.), an embedded multimedia cad (eMMC), a universal flash storage (UFS) device, and a USB storage device.

The nonvolatile memories 1100 may be configured to optionally receive an external high voltage Vpp. Each of the nonvolatile memories 1100 may be configured to internally perform an XOR operation (or parity operation).

The memory controller 1200 is connected to the nonvolatile memories 1100 through a plurality of channels CH1 to CHi (i being an integer greater than or equal to 2). The memory controller 1200 may implement a RAID in nonvolatile memories 1100 connected to a plurality of channels or in nonvolatile memories connected to a single channel. In some example embodiments, the implementation of the RAID may be achieved optionally/selectively by a user. For example, a button to select the RAID implementation may be provided outside the storage device 1000. In addition, the RAID implementation may be optionally achieved according to a request of a host. Alternatively, the RAID implementation may be started according to a scheme of the storage device 1000 when a specific condition is satisfied.

In some example embodiments, the memory controller 1200 may translate a single requested logical address into at least two physical addresses indicating areas to be written into at least two different nonvolatile memories during an input/output operation to implement a RAID. This address translation may be managed by a management table.

The memory controller 1200 includes at least one processor 1210, a buffer memory 1220, a RAID engine 1225, an error correction circuit (ECC) 1230, a host interface 1250, and a nonvolatile memory interface 1260.

The buffer memory 1220 may be configured to temporarily store data required for operations (write, read, and management operations) of the memory controller 1200. The buffer memory 1220 may receive data from an external entity during a data input operation and output the read data to the external entity during a data output operation. The buffer memory 1220 may include a plurality of memory lines to store data or a command. The data lines may be mapped into cache lines in various manners.

The RAID engine 1225 may receive read data from the nonvolatile memories 1100 during a read operation, transmit the read data to the buffer memory 1220 when the read data need not be restored, restore the read data using a parity when the read data need to be restored, and transmit the restored data to the buffer memory 1220. The RAID engine may be implemented with software, hardware or firmware and may be configured to be activated only during a read operation.

In other embodiments, the RAID engine 1225 may be configured such that the processor 1210 reads data and a parity stored in the nonvolatile memory device 1100 and performs data restoration in a deactivated state of the RAID engine 1225 during a read operation.

The ECC 1230 may calculate an error correction code value of data to be programmed during a write operation and correct an error of data read during a read operation based on the error correction code value. Although not shown, a code memory may be further provided to store code data required for operating the memory controller 1200. The code memory may be implemented with a nonvolatile memory device. In some example embodiments, the ECC 1230 may correct an error using coded modulation such as low-density parity check (LDPC) code, BCH code, turbo code, Reed-Solomon code, convolution code, recursive systematic code (RSC), trellis-coded modulation (TCM), and block code modulation (BCM).

The host interface 1250 may provide interfacing with an external device. The host interface 1250 may be a NAND flash interface. The host interface 1250 may be connected to a host through various interfaces such as parallel AT attachment bus (PATA bus), serial AT attachment bus (SATA bus), SCSI, USB, PCIe, SD, SAS, and UFS and may be implemented with a plurality of interfaces.

The nonvolatile memory interface 1260 may provide interfacing with the nonvolatile memory device 1100. The nonvolatile memory interface 1260 may be a NAND interface or a VNAND interface.

Although not shown, the memory controller 1200 may have a wireless communication function (e.g., WiFi).

The storage device 1000 may constitute a RAID internally to significantly improve reliability of data.

Figure 8:
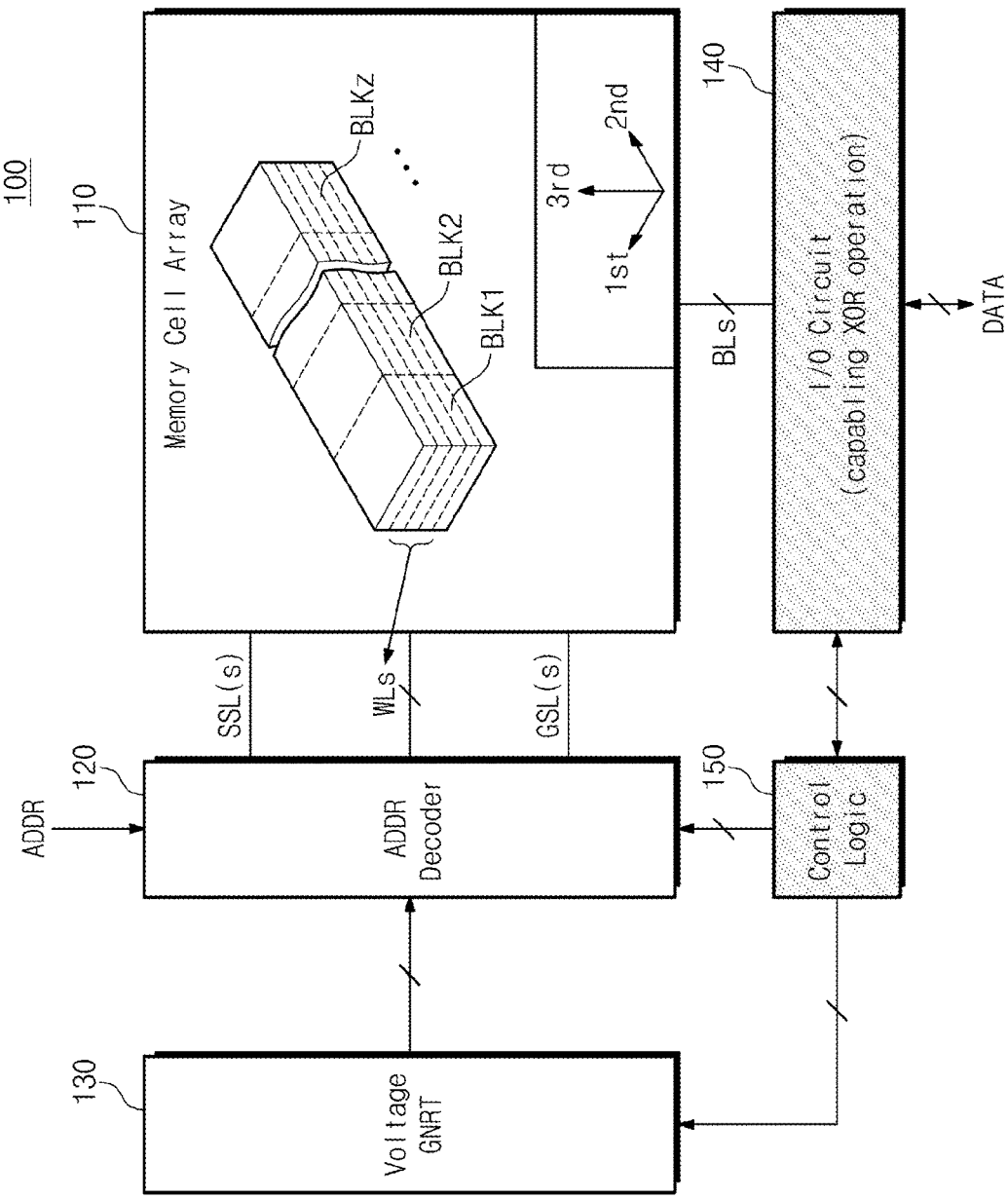
FIG. 8 is a block diagram illustrating an example embodiment of a nonvolatile memory device according to the inventive concept.

FIG. 8 is a block diagram illustrating an example embodiment of a nonvolatile memory device 100 according to the inventive concept. As illustrated, the nonvolatile memory device 100 includes a memory cell array 110, an address decoder (ADDR Decoder) 120, a voltage generation circuit (Voltage GNRT) 130, an input/output circuit (I/O Circuit) 140, and a control logic 150.

The memory cell array 110 includes a plurality of memory blocks BLK1 to BLKz (z being an integer greater than or equal to 2). Each of the memory blocks BLK1 to BLKz is connected to the address decoder 120 through a back-gate line BGL, wordlines WLs, at least one string select line SSL, and at least one ground select line GSL and is connected to the I/O circuit 140 through bitlines BLs. In some example embodiments, the wordlines WLs may be implemented in the form of stacked plates.

Each of the memory blocks BLK1 to BLKz includes a plurality of strings having a three-dimensional structure that are arranged on a substrate in a first direction and a second direction different from the first direction and arranged on the substrate in a third direction perpendicular to a plane formed in the first direction and the second direction. Each of the strings includes at least one string selection transistor, a plurality of memory cells, and at least one ground selection transistors coupled in series between a bitline and a common source line (CSL). Each of the memory cells may store at least one bit.

In some example embodiments, at least one dummy cell may be included between at least one string selection transistor and a plurality of memory cells. In other embodiments, at least one dummy cell may be included between a plurality of memory cells and at least one ground selection transistor.

The address decoder 120 may select one of the memory blocks BLK1 to BLKz in response to an address. The address decoder 120 is connected to the memory cell array 110 through the wordlines WLs, the at least one string selection line SSL, and the at least one ground select line GSL. The address decoder 120 selects the wordline WLs, the string selection line SSL, and the ground selection line GSL using a decode row address. In addition, the address decoder 120 may decode a column address of an input address. The decoded column address may be transmitted to the I/O circuit 140. In some example embodiments, the address decoder 120 may include a row decoder, a column decoder, an address buffer, and the like.

The voltage generation circuit 130 may generate voltages required for operations (a program voltage, a pass voltage, a read voltage, a read pass voltage, a verify voltage, an erase voltage, a common source line voltage, a well voltage, etc.). The voltage generation circuit 130 may generate a wordline voltage required for program/read/erase operations.

The I/O circuit 140 is connected to the memory cell array 110 through bitlines BLs. The I/O circuit 140 may be configured to receive a decoded column address from the address decoder 120. The I/O circuit 140 may select bitlines BLs using the decoded column address.

The I/O circuit 140 includes a plurality of page buffers to store data to be programmed during a program operation or to store read data during a read operation. Each of the page buffers may include a plurality of latches LAT1 to LATk (see FIG. 6). During a program operation, the data stored in the page buffers may be programmed into a page corresponding to a selected memory block through bitlines BLs. During a read operation, the data read from the page corresponding to the selected memory block may be stored in the page buffers through the bitlines BLs.

The I/O circuit 140 may read data from a first region of the memory cell array 110 and store the read data in a second region of the memory cell array 110. For example, the I/O circuit 140 may be configured to perform a copyback operation.

The I/O circuit 140 may manage a plurality of latches LAT1 to LATk (see FIG. 6) according to the control of the control logic 150 to perform an XOR operation. An XOR operation performed by the I/O circuit 140 will be described in U.S. Pat. Nos. 7,296,128, 7,729,175, 8,339,854, 8,751,729, 8,812,933, 8,856,428, US 2012-0221775, US 2013-0124783, US 2013-0135932, US 2013-0135934, US 2014-0022853, US 2014-0029355, US 2014-0108895, US 2014-0153331, US 2014-0185377, and US 2014-0281174, the contents of which are incorporated herein by references in their entirety.

The control logic 150 may control the overall operation (program/read/erase operations, etc.) of the nonvolatile memory device 100. The control logic 150 may operate in response to externally input control signals CTRL or command.

In addition, the control logic 150 may manage latches included in page buffers during a parity generation operation of a write operation to perform an XOR operation.

In addition, the control logic 150 may differentially control the latch management to perform only a read operation and the latch management to simultaneously perform a parity operation and a read operation. This was described with reference to FIG. 6 and will not be described in further detail.

Figure 9:
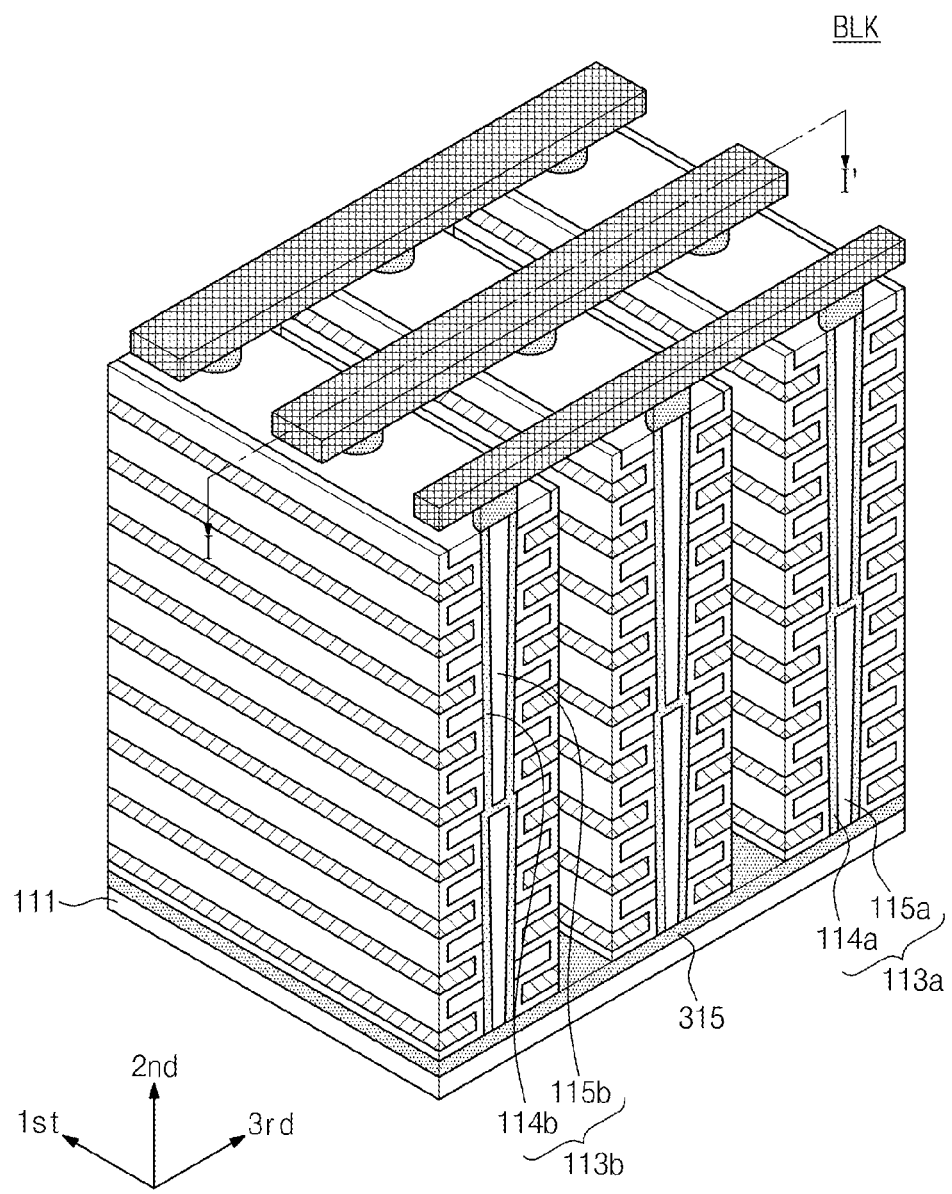
FIG. 9 is an example perspective view of one of the blocks shown in FIG. 8.
Figure 10:
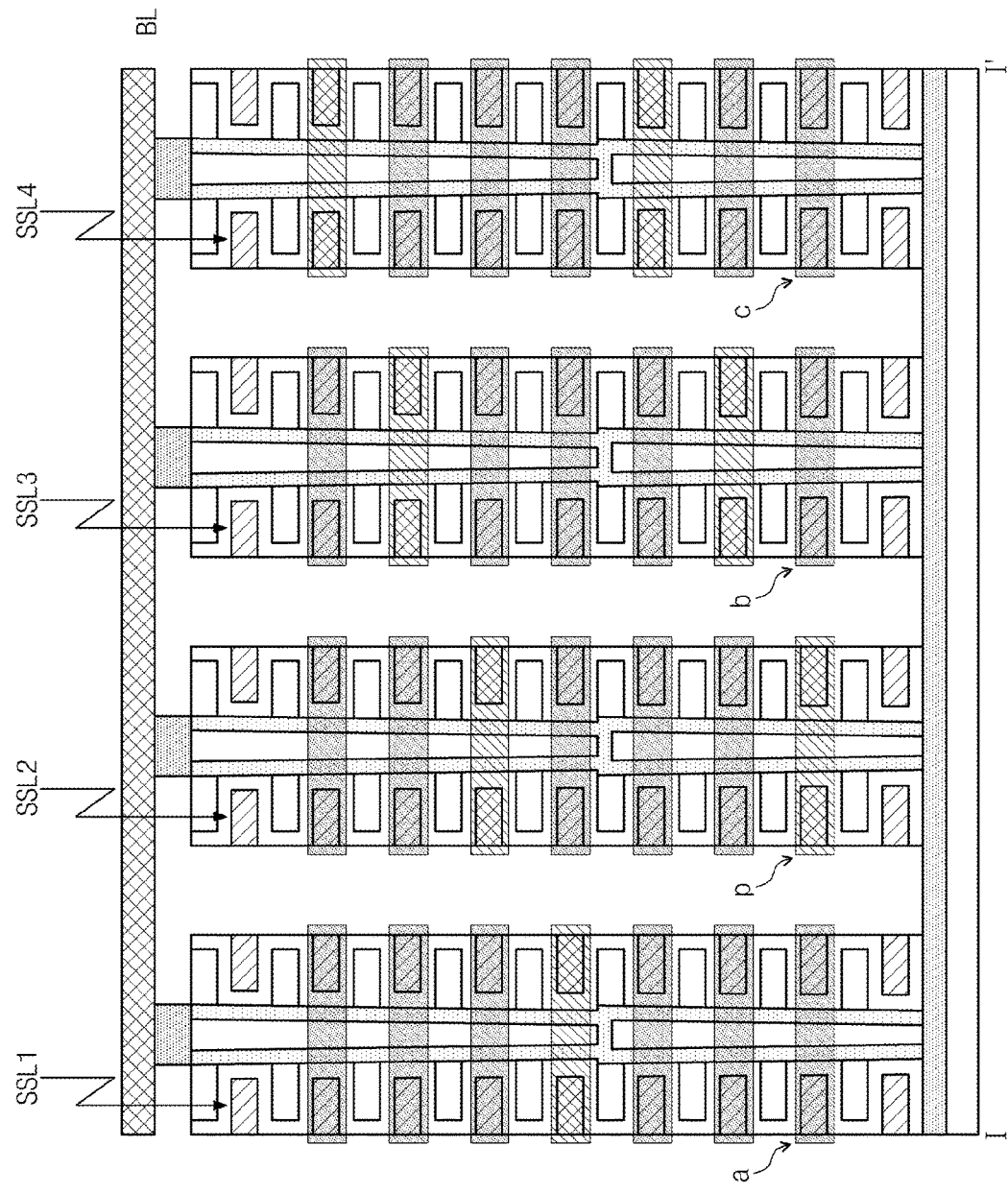
FIG. 10 is a cross-sectional view taken along the line I-I' in FIG. 9.

FIG. 9 is an example perspective view of one of the blocks BLK1 to BLKz shown in FIG. 8, and FIG. 10 is a cross-sectional view taken along the line I-I' in FIG. 9. Referring to FIGS. 9 and 10, in a block BLK, a single pillar includes a first sub-pillar 113a and a second sub-pillar 113b.

A first sub-pillar 113a is provided on a substrate 111. In example embodiments, a surface layer 114a of the first sub-pillar 113a includes a p-type silicon material. The surface layer 114a of the sub-pillar 113a acts as a body in a second direction. An inner layer 115a of the first sub-pillar 113a includes an insulating material. A second sub-pillar 113b is provided on the first sub-pillar 113a. In example embodiments, a surface layer 114b of the second sub-pillar 113b includes a p-type silicon material. The surface layer 114b of the second sub-pillar 113b acts as a body in a second direction. An inner layer 115b of the second sub-pillar 113b includes an insulating material.

In example embodiments, the surface layer 114a of the first sub-pillar 113a and the surface layer 114b of the second sub-pillar 113b are connected to each other. For example, the surface layer 114a of the first sub-pillar 113a and the surface layer 114b of the second sub-pillar 113b may be connected to each other through a p-type silicon pad SIP.

In example embodiments, first conductive materials each having height corresponding to the silicon pad SIP, i.e., fifth height may constitute a dummy wordline DWL and a dummy memory cell DMC. For example, when a memory block BLKb is divided into a plurality of sub-blocks in the second direction, the memory block BLKb may be divided into sub-blocks on the basis of the height corresponding to the silicon pad SIP.

The details of a memory block according to the inventive concept are described in U.S. Pat. No. 8,559,235, filed by Samsung Electronics Co., Ltd., the content of which is incorporated herein by reference in their entirety.

According to the inventive concept, a RAID may be implemented within a block of a nonvolatile memory device.

Continuing to refer to FIG. 10, an example embodiment of implementing a RAID within a block is shown. As shown in FIG. 10, four strings are connected to a single bitline BL. The RAID may be implemented by controlling string selection lines SSL1, SSL2, SSL3, and SSL4 to select each string. A parity p may be stored in a memory cell connected to at least one string among memory cells of the same layer, and original data a, b, and c may be stored in the other memory cells. The parity p may be generated and stored by a latch operation of a page buffer (see FIG. 6) connected to a bitline BL. When certain data need to be restored, data restoration may be performed based on the other data and a parity.

It will be understood that the number of strings connected to a single bitline is not limited to four shown in FIG. 10.

Although a parity is stored in only one string as shown in FIG. 10, the inventive concept need not be limited thereto. The inventive concept may store parities in at least two strings.

Figure 11:
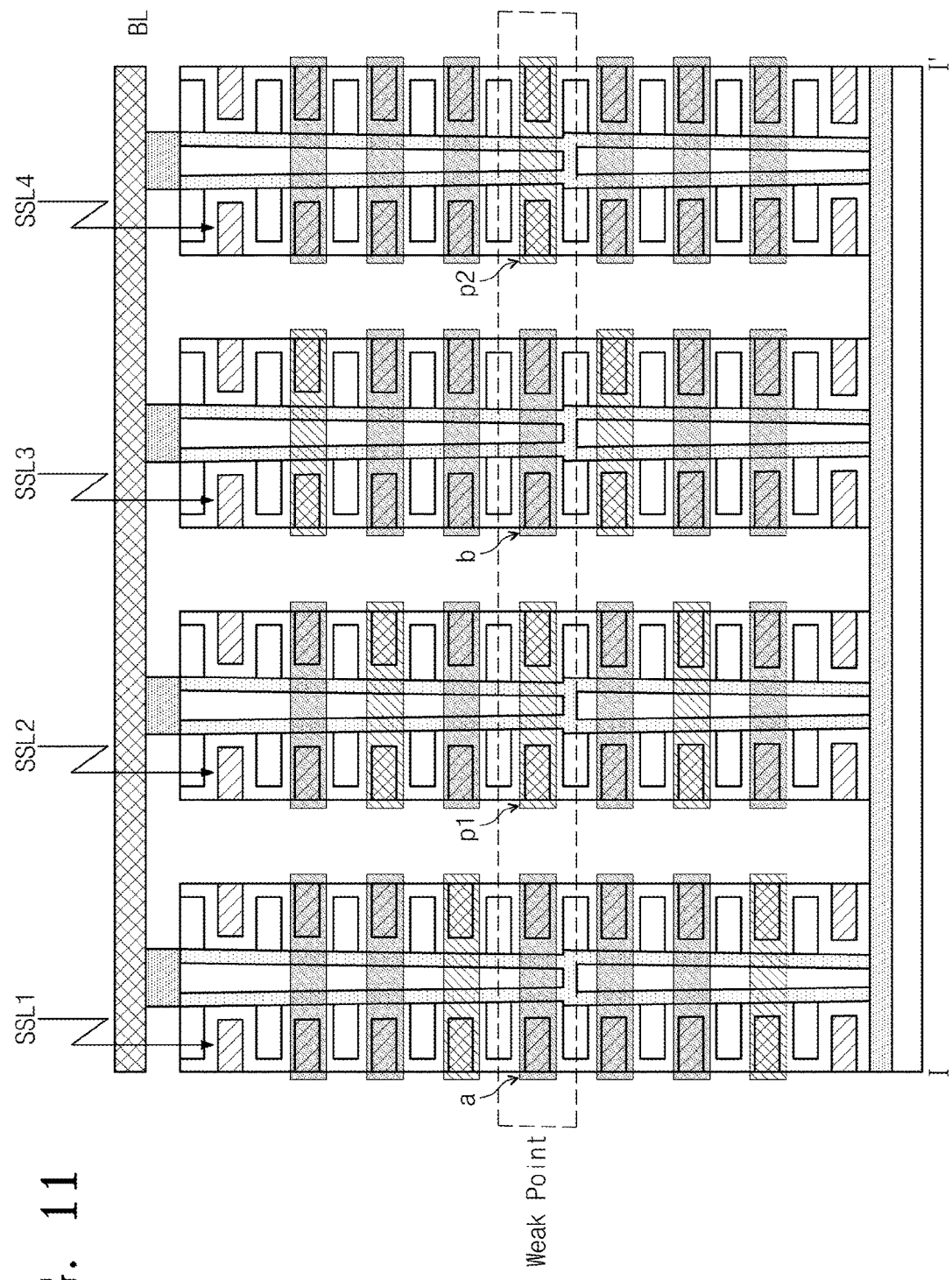
FIG. 11 illustrates an example embodiment of storing parities in two strings according to the inventive concept.

FIG. 11 illustrates an example embodiment of storing parities in two strings according to the inventive concept. Referring to FIG. 11, in case of a memory cell judged to have low data reliability in process, parities p1 and p2 may be stored in two strings to enhance the data reliability.

The inventive concept may be applied to a block with another structure.

Figure 12:
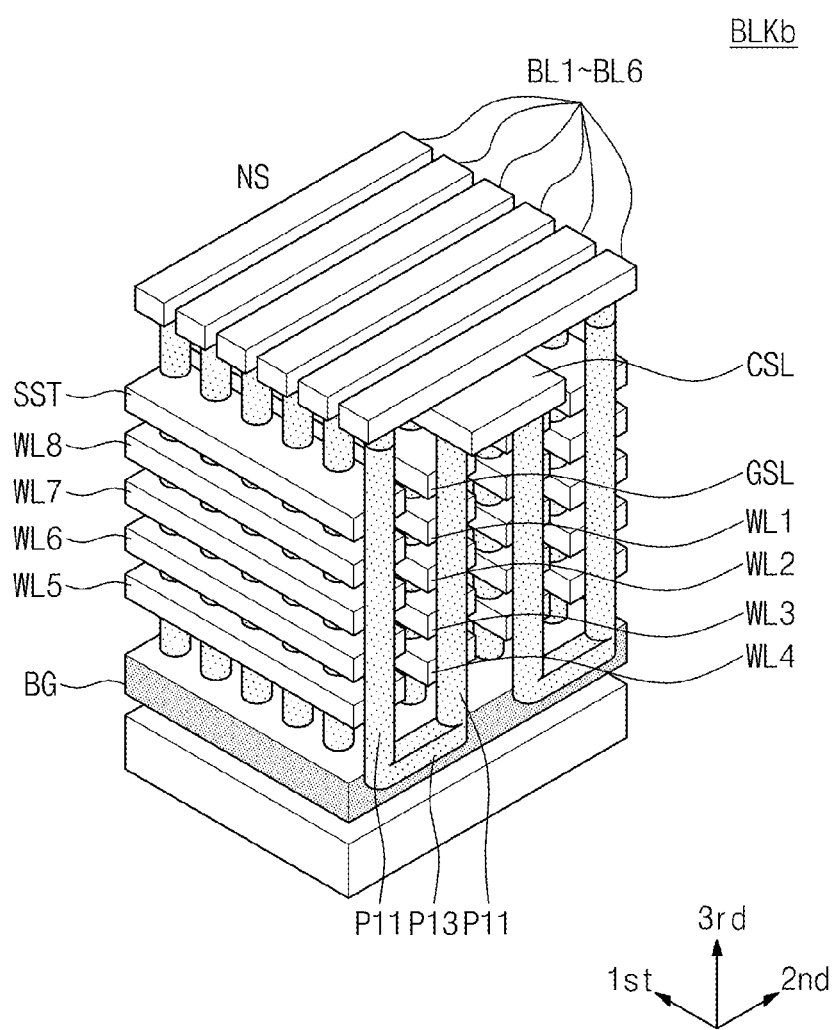
FIG. 12 illustrates a memory block according to another embodiment of the inventive concept.

FIG. 12 illustrates a memory block BLKb according to another embodiment of the inventive concept. For the convenience of description, let it be assumed that the number of wordline layers is four. The memory block BLKb is implemented with a pipe-shaped bit cost scalable (PBiCS) structure where lower ends of adjacent memory cells connected in series are connected by a pipe. A memory block BLK includes strings NS of mxn (m and n being positive integers).

In FIG. 2, m=6 and n=2. Each of the strings NS includes serially connected memory cells MC1 to MC8. First upper ends of the memory cells MC1 to MC8 are connected to a string select line SSL, and second upper ends of the memory cells MC1 to MC8 are connected to a ground select transistor GST. Lower ends of the memory cells MC1 to MC8 are pipe-connected.

Memory cells constituting a string NS are stacked on a plurality of semiconductor layers to be formed. Each string NS includes a first pillar P11, a second pillar P12, and a pillar connection portion P13 connecting the first and second pillars P11 and P12 to each other. The first pillar P11 is connected to a bitline (e.g., BL1) and the pillar connection portion P13 and is formed through the ground select line GSL and wordlines WL1 to WL4. As shown in FIG. 12, the string NS is implemented in the form of a U-shaped pillar.

In some example embodiments, a back-gate BG may be formed on a substrate 111 and the pillar connection portion P13 may be implemented in the back-gate BC. In some example embodiments, a back-gate BG may commonly exist in blocks BLK. The back-gate BG may be isolated from a back-gate of another block.

According to the inventive concept, a RAID may be implemented in a plurality of memory blocks.

Figure 13:
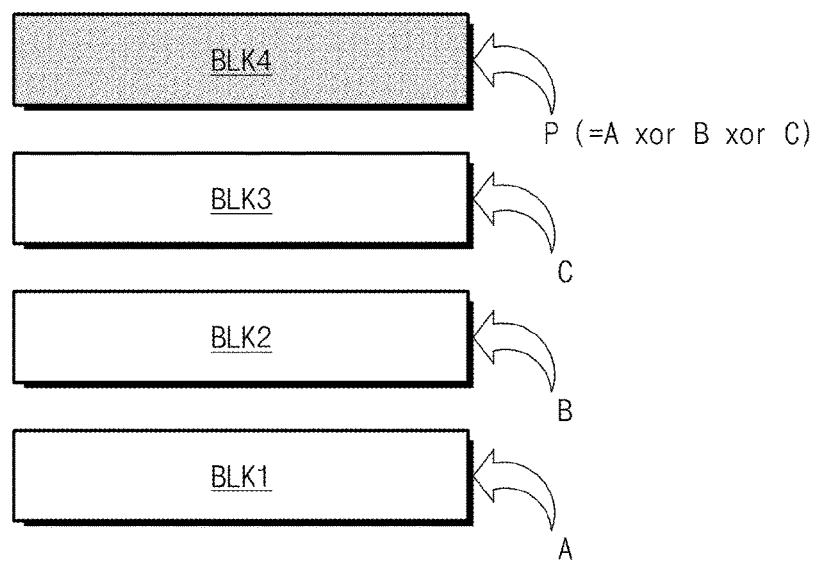
FIG. 13 conceptually illustrates a RAID implemented in a plurality of memory blocks according to an example embodiment of the inventive concept.

FIG. 13 conceptually illustrates a RAID implemented in a plurality of memory blocks according to an example embodiment of the inventive concept. Referring to FIG. 13, a program operation is performed on normal data A, B, and C in memory blocks BLK1 to BLK3 and a program operation is performed on parity data P in a single block BLK4. The parity data is a result value of an XOR operation on the data A, B, and C. Although not shown, the XOR operation may be performed in a page buffer.

According to the inventive concept, a RAID may be implemented at a plurality of plains (or mats). Each of the plains includes a plurality of memory blocks sharing bitlines.

Figure 14:
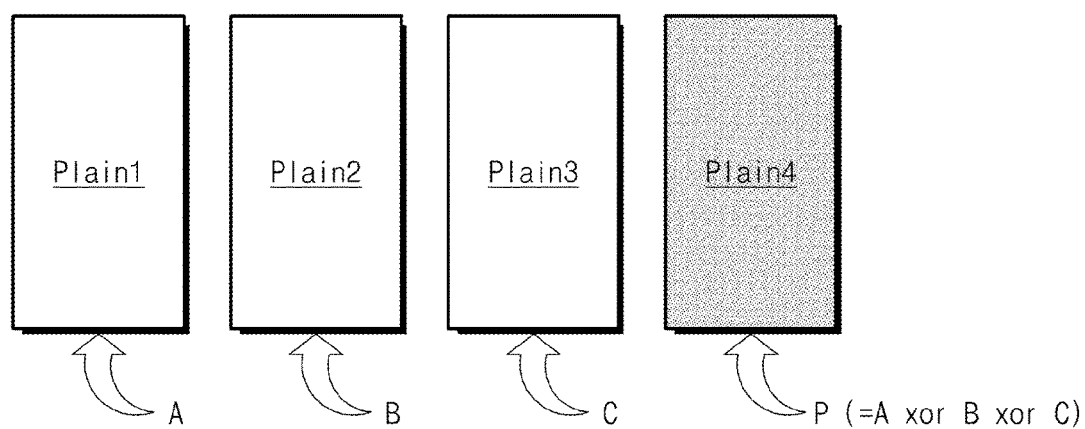
FIG. 14 conceptually illustrates implementation of a RAID at a plurality of plains according to an example embodiment of the inventive concept.

FIG. 14 conceptually illustrates implementation of a RAID at a plurality of plains according to an example embodiment of the inventive concept. Referring to FIG. 14, a program operation is performed on normal data A, B, and C at plains Plain1 to Plain3 and a program operation is performed on parity data P at another plain Plain4. The parity data is a result value of an XOR operation on the data A, B, and C. Although not shown, the XOR operation may be performed in a page buffer.

Figure 15:
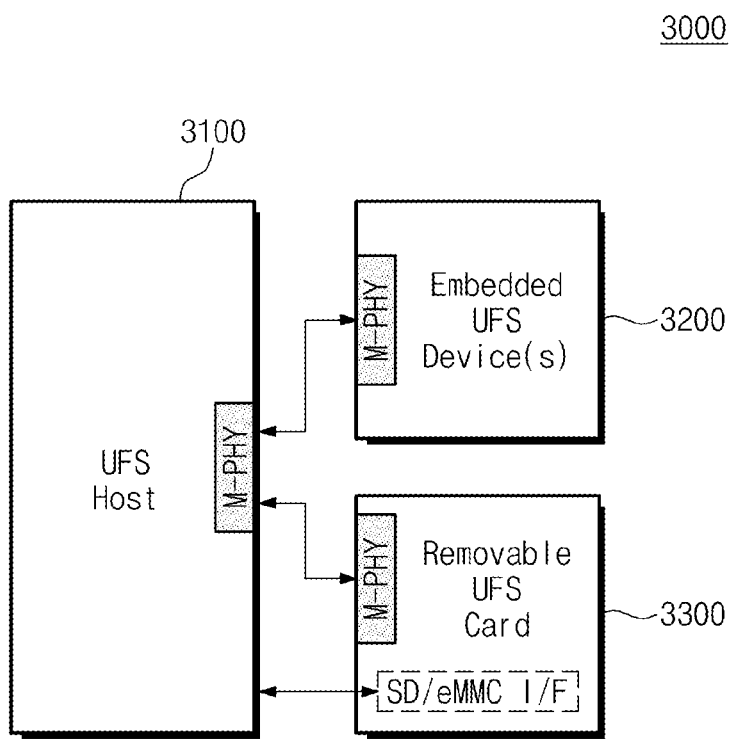
FIG. 15 is an example block diagram of a UFS system according to an example embodiment of the inventive concept.

On the other hand, the inventive concepts may be applied to a universal flash storage (UFS). FIG. 15 is an example block diagram of a UFS system 3000 according to an example embodiment of the inventive concept. As illustrated, the UFS system 3000 may include a UFS host 3100, at least one embedded UFS device 3200, and a removable UFS card 3300. Communication between the UFS host 3100 and the embedded UFS device 3200 and communication between the UFS host 3100 and the removable UFS card 3300 may be performed through an M-PHY layer.

At least one of the embedded UFS device 3200 and the removable UFS card 3300 may be a storage device capable of implementing a RAID, as shown in FIGS. 1 to 14.

The host 3100 may include a bridge allowing communication to be performed not by a UFS protocol but by another protocol. Communication between the UFS host 3100 and the removable UFS card 3400 may be performed by various card protocols (e.g., UFDs, MMC, eMMC SD (secure digital), mini SD, Micro SD, etc.).

Figure 16:
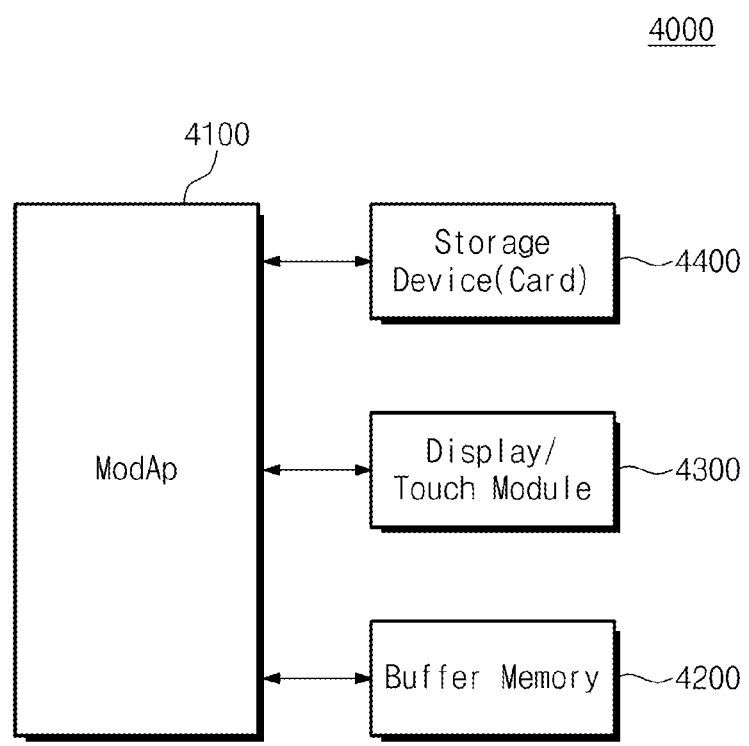
FIG. 16 is an example block diagram of a mobile device according to an example embodiment of the inventive concept.

The inventive concepts may be applied to a mobile device. FIG. 16 is an example block diagram of a mobile device 4000 according to an example embodiment of the inventive concept. As illustrated, the mobile device 4000 includes an integrated processor (ModAp) 4100, a buffer memory 4200, a display/touch module 4300, and a storage device 4400.

The integrated processor 4100 may be configured to control the overall operation of the mobile device 4000 and wired/wireless communication with an external entity. The buffer memory 4200 may be configured to temporarily store data required for a processing operation of the mobile device 4000. The display/touch module 4300 may be configured to display data processed by the integrated processor 4100 or receive data from a touch panel. The storage device 4400 may be configured to store user data. The storage device 4400 may be an eMMC, an SSD or a UFS device. The storage device 4400 may implement a RAID internally or in itself, as described with reference to FIGS. 1 to 14.

The mobile device 4000 may provide a RAID environment to improve reliability of data and achieve optimal operation performance.

Figure 17:
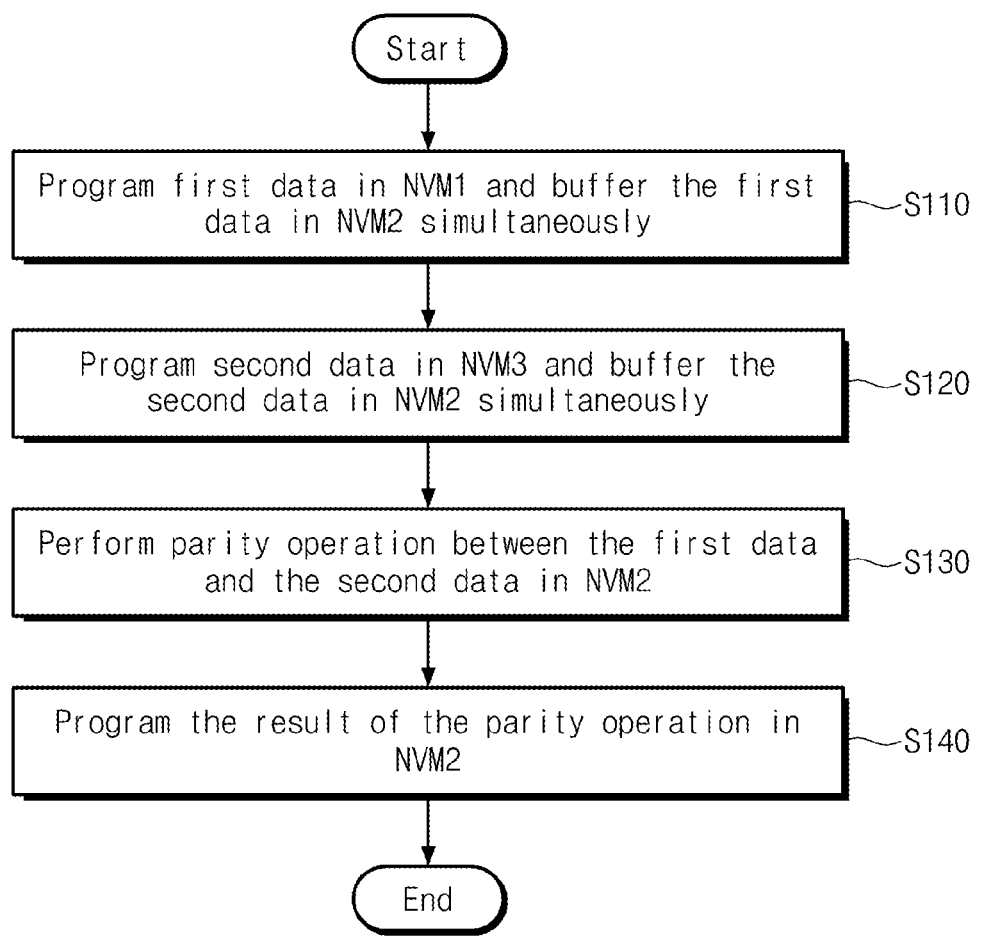
FIG. 17 is a flowchart summarizing an example embodiment of a write method of a storage device according to an example embodiment of the inventive concept.

FIG. 17 is a flowchart summarizing an example embodiment of a write method of a storage device 1000 according to an example embodiment of the inventive concept. The write method of the storage device 1000 will now be described with reference to FIGS. 1 to 17.

First data is received from an external entity (host) and the received first data is programmed into the first nonvolatile memory device NVM1. At the same time, the received first data is buffered in the second nonvolatile memory device NVM2 to generate a parity (S110).

Second data is received from the external entity and the received second data is programmed into the third nonvolatile memory device NVM3. At the same time, the received second data is buffered in the second nonvolatile memory device NVM2 to generate a parity (S120). A parity operation (or latch operation) is performed in the second nonvolatile memory device NVM2 in real time or for an idle time to generate a parity (S130). For example, the parity operation may be an XOR operation between the first data and the second data. A result value of the latch operation is programmed into the second nonvolatile memory device NVM2 as a parity (S140).

According to the write method of the storage device 1000, a result value obtained through a parity operation is programmed as a parity.

According to the write method described in FIG. 17, a data program operation and a parity program operation are individually performed. However, a write method according to the inventive concept is not limited thereto. That is, a data program operation and a parity program operation may be simultaneously performed.

Figure 18:
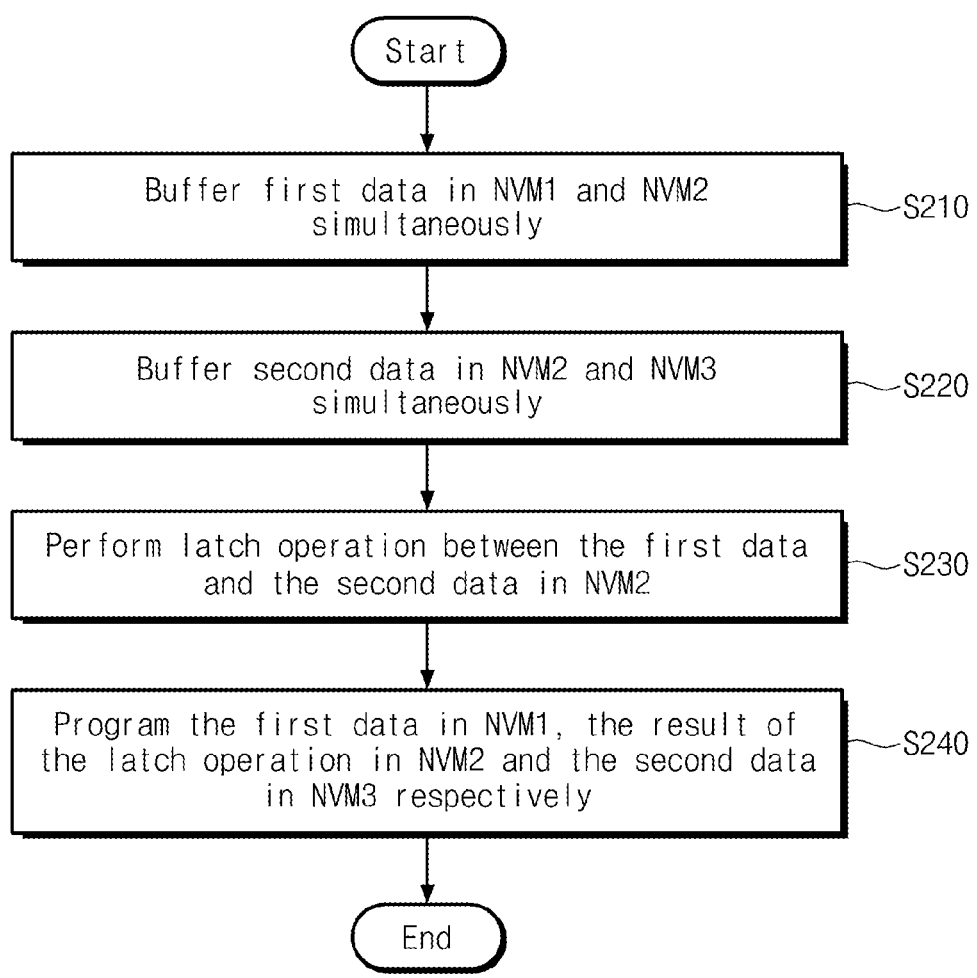
FIG. 18 is a flowchart summarizing another embodiment of a write method of a storage device according to an example embodiment of the inventive concept.

FIG. 18 is a flowchart summarizing another embodiment of a write method of a storage device 1000 according to an example embodiment of the inventive concept. The write method of the storage device 1000 will now be described with reference to FIGS. 1 to 16 and FIG. 18.

First data is simultaneously buffered in the first nonvolatile memory device NVM1 and the second nonvolatile memory device NVM2 (S210). Second data is simultaneously buffered in the second nonvolatile memory device NVM2 and the third nonvolatile memory device NVM3 (S220). A parity operation is performed on the first data and the second data in the second nonvolatile memory device NVM2 to generate a parity (S230). The first data, the second data, and a parity are programmed into the first nonvolatile memory device NVM1, the third nonvolatile memory device NVM3, and the second nonvolatile memory device NVM2, respectively (S240). In some example embodiments, a program operation may be simultaneously performed in the first to third nonvolatile memories NVM1 to NVM3.

According to the above-described write method of the storage device 1000, data and a parity may be simultaneously programmed.

Figure 19:
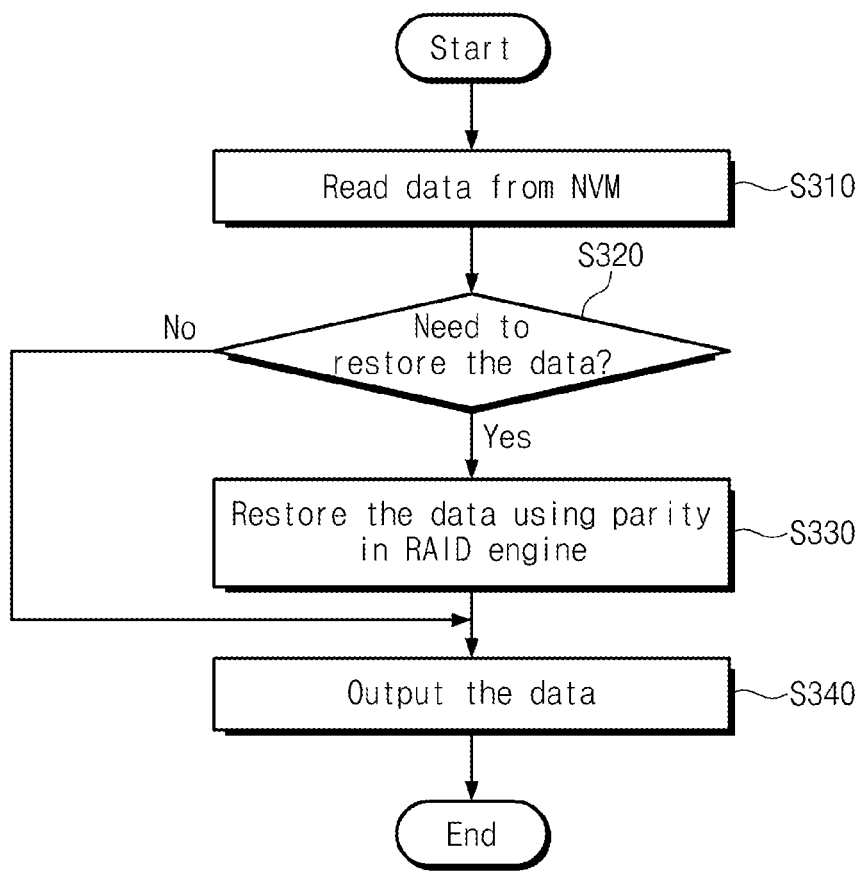
FIG. 19 is a flowchart summarizing a read method of a storage device according to an example embodiment of the inventive concept.

FIG. 19 is a flowchart summarizing a read method of a storage device 1000 according to an example embodiment of the inventive concept. The read method of the storage device 1000 will now be described with reference to FIGS. 1 to 19.

When there is a read request from an external entity (host), data is read from a nonvolatile memory device NVM corresponding to the read request (S310). A determination is made on whether the read data needs to be restored (S320). The determination may be made by a RAID engine 1225 (see FIG. 3). For example, when an error of the read data cannot be corrected, restoration using a parity may be decided. If data restoration is decided, the RAID engine 1225 reads a parity corresponding to data from a nonvolatile memory device and data is restored using the parity (S330). Meanwhile, when data need not be restored or data restoration is completed, the data is output to an external entity (S340).

According to the above-described read method of the storage device 1000, data restoration may be performed using the RAID engine 1225.

A memory system or a storage device according to an example embodiment of the inventive concept may be packaged as one of various types to be subsequently embedded. For example, the memory system or the storage device may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

While the present disclosure has been particularly shown and described with reference to example embodiments thereof, the general inventive concept is not limited to the above-described embodiments. It will be understood by those of ordinary skill in the art that various changes and variations in form and details may be made therein without departing from the spirit and scope of the inventive concept as defined by the following claims.

What is claimed is:

1. An operating method of a storage device having at least one nonvolatile memory device, wherein the at least one nonvolatile memory device includes a three-dimensional memory array, wherein the three-dimensional memory array includes a plurality of memory strings perpendicular to a substrate, comprising:
    buffering first data in a page buffer of a first nonvolatile memory device and a page buffer of a second nonvolatile memory device, simultaneously;
    buffering second data in the page buffer of the second nonvolatile memory device and a page buffer of a third nonvolatile memory device, simultaneously;
    performing a parity operation on the first data and the second data in the page buffer of the second nonvolatile memory device to generate a parity; and
    programming the first data, the second data, and the parity into the first nonvolatile memory device, the third nonvolatile memory device, and the second nonvolatile memory device, respectively.

2. The operating method as set forth in claim 1, wherein the first and second nonvolatile memories are simultaneously activated in response to corresponding chip enable signals when the first data is simultaneously buffered in the respective page buffers of the first and second nonvolatile memories, or
    wherein the second and third nonvolatile memories are simultaneously activated in response to corresponding chip enable signals when the first data is simultaneously buffered in the respective page buffers of the second and third nonvolatile memories.

3. The operating method as set forth in claim 1, wherein the parity operation is performed in real time.

4. The operating method as set forth in claim 1, wherein the parity operation is performed at an idle time.

5. The operating method as set forth in claim 1, wherein the parity operation is an XOR operation.

6. The operating method as set forth in claim 1, further comprising:
    determining whether data read from a certain nonvolatile memory device is desired to be restored when there is a read request.

7. The operating method as set forth in claim 6, wherein a redundant array of independent disks (RAID) engine determines whether the read data is desired to be restored.

8. The operating method as set forth in claim 7, wherein the read data is restored when an error of the read data cannot be corrected.

9. The operating method as set forth in claim 7, wherein the read data is restored using a parity corresponding to the read data stored in another nonvolatile memory device.

10. The operating method as set forth in claim 1, further comprising:
    inputting the first data to a buffer memory;
    transmitting the first data to the first nonvolatile memory device and the second nonvolatile memory device from the buffer memory, simultaneously;
    inputting the second data to the buffer memory; and transmitting the second data to the second nonvolatile memory device and the third nonvolatile memory device from the buffer memory, simultaneously.

11. The operating method as set forth in claim 1, wherein the parity operation is performed by controlling a plurality of latches, and
wherein some of the latches are used only in a read request for the second nonvolatile memory device when the read request is input while the parity operation is performed.

12. A storage device comprising:
a plurality of nonvolatile memories having a three-dimensional memory array, wherein the three-dimensional memory array includes a plurality of memory strings perpendicular to a substrate; and
a memory controller configured to control the nonvolatile memories,
wherein the memory controller is configured to transmit first data to a first nonvolatile memory device among the nonvolatile memories to perform a program operation and is configured to transmit the first data to a second nonvolatile memory device among the nonvolatile memories to perform a parity operation for generating a parity when there is a write request for the first data, and
wherein the memory controller is configured to transmit second data to a third nonvolatile memory device among the nonvolatile memories to perform a program operation and is configured to transmit the second data to the second nonvolatile memory device to perform a parity operation for generating a parity when there is a write request for the second data,
wherein each of the nonvolatile memories includes a page buffer including a plurality of latches configured to perform the parity operation.

13. The storage device as set forth in claim 12, wherein the first, second, and third nonvolatile memories are connected to the memory controller through their respective channels.

14. The storage device as set forth in claim 12, wherein the first, second, and third nonvolatile memories are connected to the memory controller through a single channel.

15. The storage device as set forth in claim 12, further comprising:
a redundant array of independent disks (RAID) engine configured to determine whether data read from one of the nonvolatile memories is desired to be restored when there is a read request, read a parity corresponding to the read data from another nonvolatile memory device when the read data is desired to be restored, and restore the read data using the read parity.

16. The storage device as set forth in claim 12, further comprising:
a buffer memory configured to receive data from an external entity when there is a write request or output read data or restored data to the external entity when there is a read request.

17. The storage device as set forth in claim 12, wherein the parity operation is configured to be performed at an idle time.

18. A nonvolatile memory device comprising:
a memory cell array including a plurality of memory blocks sharing bitlines, wherein the memory cell array includes a plurality of memory strings perpendicular to a substrate;
an address decoder configured to select at least one selected memory block of the memory blocks in response to an address;
an input/output circuit connected to the bitlines and configured to receive input data from an eternal entity during a program operation on the selected memory block; and
a control logic configured to control the address decoder and the input/output circuit such that a parity is programmed into the selected memory block according to an external command,
wherein the input/output circuit is configured to perform a parity operation on previously buffered data and the input data according to the control of the control logic to generate the parity, the parity operation being performed in a page buffer of the memory cell array.

* * * * *